United States Patent [19]

Thompson

[11] 3,864,161

[45] Feb. 4, 1975

[54] METHOD AND APPARATUS FOR ADJUSTING RESONATORS FORMED ON A PIEZOELECTRIC WAFER

[75] Inventor: Edwin C. Thompson, Epping, N.H.

[73] Assignee: Western Electric Company, Incorporated, New York, N.Y.

[22] Filed: Aug. 10, 1973

[21] Appl. No.: 387,580

[52] U.S. Cl. .................. 117/212, 29/25.35, 29/593, 117/38, 118/8, 118/9, 118/505

[51] Int. Cl. .............................................. B44d 1/18

[58] Field of Search ........... 29/25.35, 593; 117/212, 117/38; 118/8, 9, 504, 505; 324/56

[56] References Cited

UNITED STATES PATENTS

| | | | |
|---|---|---|---|
| 2,470,737 | 5/1949 | Bach | 29/25.35 |
| 2,639,392 | 5/1953 | Warner, Jr. | 29/25.35 |
| 2,765,765 | 10/1956 | Bigler et al. | 29/25.35 |
| 3,006,711 | 10/1961 | Silver | 29/25.35 |
| 3,600,675 | 8/1971 | Grenier | 29/25.35 |

*Primary Examiner*—Carl E. Hall
*Attorney, Agent, or Firm*—D. J. Kirk

[57] ABSTRACT

Each of one or more resonators formed by vapor depositing electrodes on opposite faces of a piezoelectric crystal wafer or plate, are adjusted to a predetermined resonant frequency by the deposition of a material on one electrode of each resonator. This adjustment is accomplished using a pliant, insulative mask which intimately engages and covers the surface of the crystal wafer while exposing the electrode to the deposition of the material. The material is depositied on the exposed resonator electrode and the resonant frequency simultaneously monitored until a predetermined frequency is attained.

12 Claims, 6 Drawing Figures

METHOD AND APPARATUS FOR ADJUSTING RESONATORS FORMED ON A PIEZOELECTRIC WAFER

BACKGROUND OF THE INVENTION

1. Field of the Invention

This invention relates to the manufacture of piezoelectric crystal resonators. More particularly, the invention is directed to a method and apparatus for adjusting the resonators to a predetermined frequency.

2. Description of the Prior Art

Piezoelectric crystal resonators are well known in the art. Such resonators are formed by depositing two metallic electrodes on a crystal wafer or plate. A first electrode is deposited on one major surface of the crystal wafer and the second electrode is deposited on the opposite surface of the wafer and aligned with at least a portion of the first electrode. The resonant frequency of each resonator is basically a function of the effective thickness of the resonator (i.e., wafer thickness plus electrode thickness). The smaller the effective thickness the higher the resonant frequency of the resonator.

Manufacture of such resonators normally involves two basic steps. The first step is a base plating operation wherein a metal is deposited through a mask onto a selected area of the crystal wafer to form metal electrodes having a thickness sufficiently small for the resonant frequency of the resonator to be slightly higher than the desired resonant frequency. The second step is directed to a fine adjustment or tuning of the resonant frequency by depositing additional small amounts of metal or other suitable material on one of the electrodes of the pair in order to increase the electrode thickness to lower the resonant frequency to a predetermined value. This fine adjustment by the addition of metal is fraught with problems. For example, if the metal is deposited on other than the electrode, the frequency, various electrical parameters, and the mode response are adversely affected. On the other hand, prior art masks used to physically contact the wafer in order to restrict the deposition of the metal solely to the electrode affected the frequency of the resonator in an unpredictable manner. Accordingly, if the mask does not contact the crystal wafer, metal may be deposited on other than the electrode, and, if the mask does contact the resonator, accurate frequency measurements cannot be made.

In the prior art, resonators were adjusted by electrolytically depositing additional metal, such as nickel, on the electrodes until the resonators reached a predetermined frequency. This required an operator to manually immerse, dry, and test the resonators repeatedly until the required frequency was attained. Another prior art process of adjusting crystal resonators is accomplished by the use of a mask which is spaced from the crystal wafer and has apertures which expose approximately 80 percent of the electrode surface area to a substantially nondivergent stream of metal evaporant to be deposited on the electrodes.

Thus, while the first method requires repeated manual operations, the second necessitates sophisticated positioning equipment to align the mask with the electrodes in order to avoid depositing metal on the unplated crystal surface. Additionally, it is known that resonators may be adjusted over a broader frequency range when the adjustment metal is deposited on the full surface area of the electrode.

SUMMARY OF THE INVENTION

The ins:ant invention obviates the foregoing problems with a method for adjusting the resonant frequency of a resonator, formed on a piezoelectric wafer, to a predetermined resonant frequency, by pliantly contacting the wafer with a mask having an aperture therein to expose a selected portion of the resonator, depositing material on the selected portion of the resonator through the mask to adjust the resonant frequency of the resonator, testing the resonator by exciting and monitoring the resonant frequency thereof as material is deposited on the selected portion, and stopping the deposition of material on the selected portion when the resonant frequency reaches a predetermined value.

In addition, the instant invention provides apparatus for implementing the foregoing method, having means for depositing a material, a pliant mask with an aperture therethrough to expose a selected portion of the resonator to the deposition means, the pliant mask intimately contacting the wafer while permitting substantially uninhibited excitation of the resonator, means for exciting the resonator and measuring the frequency response thereof as material from the deposition means is deposited on the selected portion, and means for stopping the deposition of material at a predetermined frequency, under the control of the excitation means.

The invention is predicated upon the fact that the instant mask, when intimately engaged with the crystal wafer, permits excitation of each resonator to a predetermined resonant frequency. This is the result of the use of a coating of pliant, insulative material on the mask that permits substantially free vibration of the excited resonator.

According to a feature of the invention, the mask is arranged to accommodate a plurality of piezoelectric crystal wafers, each wafer having one or more resonators formed thereon. All the resonators can be sequentially adjusted and tested in a vacuum without exposing any of the wafers until all resonators on each wafer have been adjusted to predetermined values.

An important advantage of the instant mask is that adjusting material can be deposited on the full surface area of the electrodes without additional material being deposited on the surface of the crystal wafer.

A further advantage is that the instant invention avoids the critical alignment problems arising when the mask and wafer are spaced apart.

DETAILED DESCRIPTION

As has been stated hereinbefore, the instant adjusting apparatus is directed to piezoelectric crystal wafers or plates having one or more electrode pairs deposited thereon. Such a wafer, having one pair of electrodes, is known in the art as a discrete resonator and provides a single frequency output. Discrete resonators have been used in crystal controlled oscillator and filter circuits for many years. A wafer having two or more electrode pairs deposited thereon, forming a plurality of resonators, provides a group or band of resonant frequencies having a combined frequency response that permits its use as a bandpass filter. This type of filter is normally referred to as a monolithic crystal filter (MCF), that is, a filter without additional components. In order to clearly set forth the inventive concepts of the instant invention the adjustment of the resonators on such a MCF will be detailed in the exemplary embodiment. However, it will be realized that the concepts associated with the adjustment of a plurality of resonators on an MCF apply equally as well to the single or discrete resonator.

Figure 1:
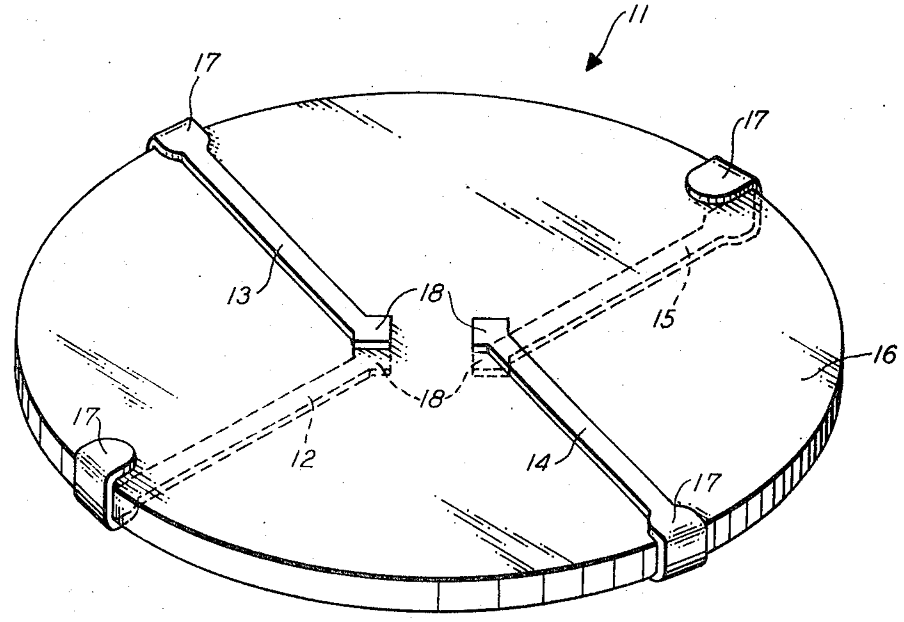
FIG. 1 is a perspective view of a monolithic crystal filter having two pairs of electrodes plated thereon.

FIG. 1 shows a MCF 11, used in the exemplary embodiment, having two pairs of electrodes 12, 13, and 14, 15 with the electrodes of each pair vapor deposited or otherwise plated on opposite faces of a wafer 16 such as an AT-cut quartz crystal wafer. Terminals 17—17 of each electrode extend across the edge of the wafer 16 and onto the opposite side of the wafer. This arrangement advantageously makes terminals 17—17 available to electrical probes or contacts from either side of the MCF 11. Additionally, the terminals 17—17 are advantageously located at the periphery of the wafer 16 because vibration is largely confined to the central area of the wafer. High frequency crystals of the thickness shear type, such as the AT-cut have only slight piezoelectric activity at the edges of the wafer.

The electrodes 12, 13, 14, and 15 also have rectangularly shaped ends 18—18 which are aligned on opposite faces of the piezoelectric crystal wafer 16. The two electrode pairs 12, 13, and 14, 15 plated on crystal wafer 16 thus form two resonators on the wafer. A high frequency potential across either pair of electrodes 12, 13 or 14, 15 will piezoelectrically generate thickness shear mode vibrations in the crystal wafer 16. The portion of the vibratory energy in the wafer 16 between one pair of electrodes, for example, electrodes 12 and 13, establishes a varying electric field at the output of the other pair of electrodes (i.e., electrodes 14 and 15).

Figure 2:
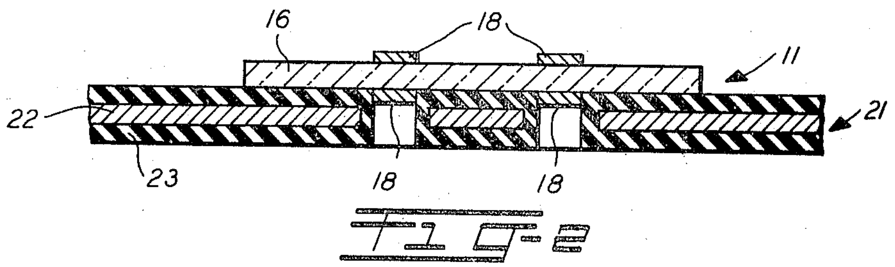
FIG. 2 is a partial cross-sectional view of a mask and a resonator which embodies features of the instant invention.

FIG. 2 is a partial cross-sectional view of a mask 21 with a MCF 11 supported thereon. The mask 21 is comprised of a base 22 with a pliant, insulative material 23. The base 22 may be a metal such as aluminum, molybdenum, etc. or a plastic such as plexiglass, to which the material 23 will adhere. The only requirement for the material used for base 22 is that it provides sufficient dimensional stability during deposition. The more precise the definition provided by the mask the more accurate the frequency adjustment.

The material 23 may be of any type (i.e., rubber, Teflon, Mylar, etc. or a coating such as a conventional photoresist) which has electrically insulative and pliant characteristics. The electrically insulative characteristic is necessary to prevent short circuiting of the resonator electrodes which may contact the mask making it impossible to obtain valid resonant frequency values.

The pliant characteristic of material 23 is important as it permits the resonators to vibrate in a substantially uninhibited manner while the wafer 16 is in intimate contact with the mask. Accordingly, the pliant material 23 should be of a sufficient thickness so that the relatively rigid base 22 provides substantially no dampening of the vibrating resonator. For example, in a working embodiment of the instant invention a 1 mil thickness of a photoresist material (AZ-340, manufactured by Azoplate Co., Murray Hill, New Jersey) applied to a 5 mil thick sheet of molybdenum has been found to be a particularly effective mask.

Figure 3:
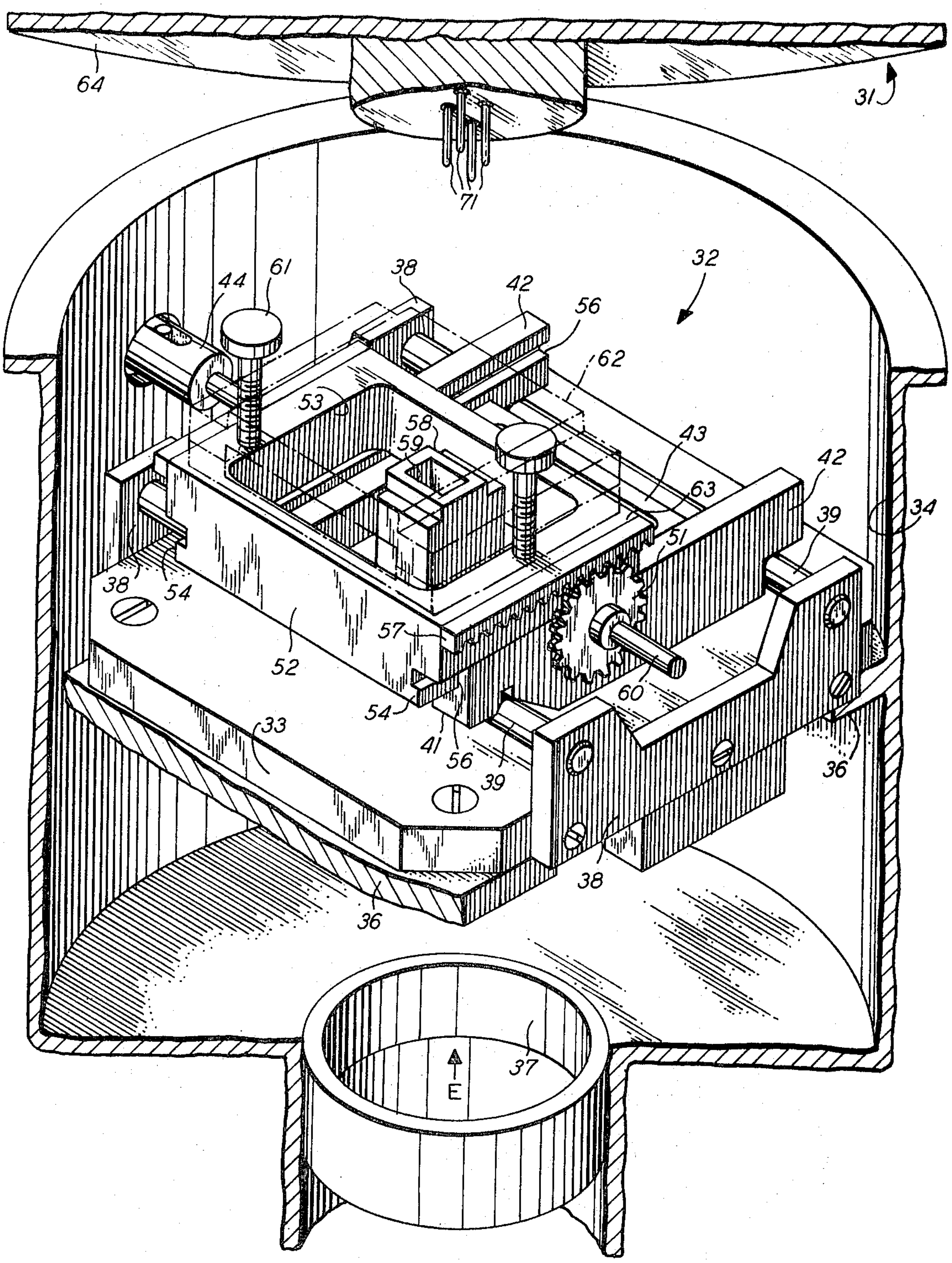
FIG. 3 is a perspective view of the evaporating and adjusting apparatus used in an exemplary embodiment of the instant invention.

FIG. 3 shows an evaporating and adjusting apparatus 31 used in an exemplary embodiment of the instant invention. An X-Y carriage 32 is mounted on a carriage base 33, inside a vacuum chamber 34, on supports 36—36. An evaporant E enters the chamber from a vapor inlet channel 37 located at the bottom of the chamber 34. End supports 38—38 are fixedly connected to the carriage base 33 and have a pair of parallel guide bars 39—39 mounted therebetween. An X-carriage 41 having spaced sides 42—42 which are connected by a joining member 43, is slideably mounted on the guide bars 39—39 in the X-direction under the control of an X-drive mechanism 44. The X-drive mechanism 44 is connected to the X-carriage 41 and causes the X-carriage to move along guide bars 39—39 as the X-drive mechanism is actuated. A Y-drive gear 51 is rotatably mounted on the X-carriage 41.

A Y-carriage 52 has a substantially rectangular shape with a hollow or open central portion 53. A tongue 54 extends from each of a pair of opposite sides of the carriage 52 for slideable engagement in grooves 56—56 in the X-carriage sides 42—42. Movement of the Y-carriage 52 is controlled by the operation of Y-drive gear 51 which imparts motion to the Y-carriage through a rack gear 57. Rotation of Y-drive gear 51 is accomplished by rotating shaft 60 in the desired direction. A chimney 58, having a flue 59, is fixedly mounted on the carriage base 33 and extends into the open central portions of both the X- and Y-carriages 41 and 52. This arrangement permits movement of the X-Y carriage 32 about chimney 58. Bolts 61—61 are provided to clamp a crystal holding fixture 62 (shown in phantom) to the Y-carriage upper surface 63. A top cover 64 for the vacuum chamber 34 is provided with a plurality of spring loaded output terminals 71—71.

Figure 4:
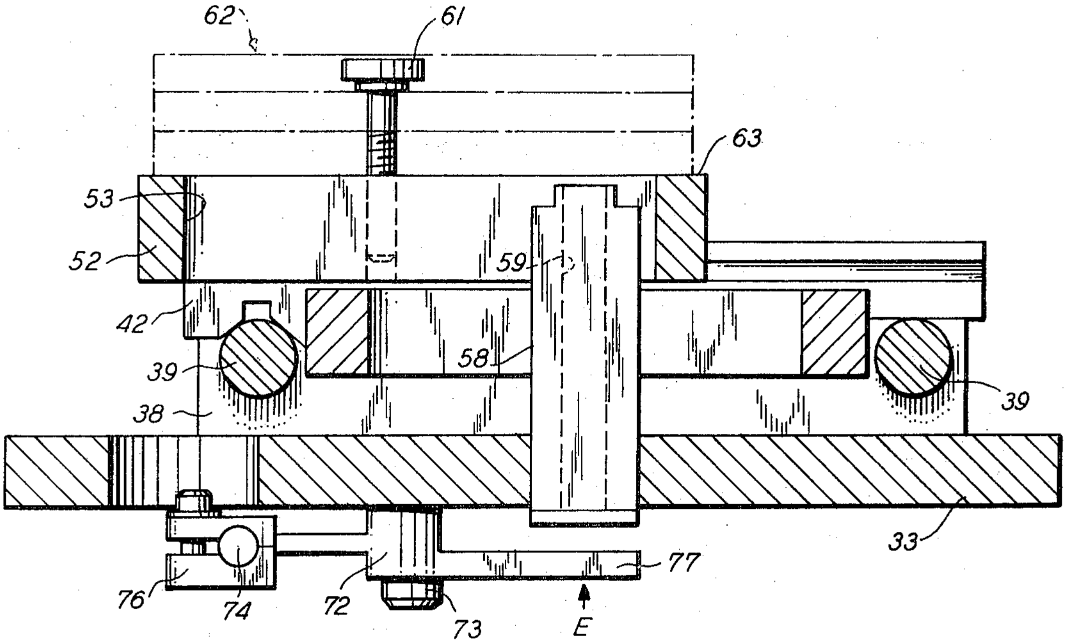
FIG. 4 is a cross-sectional view of the evaporating and adjusting apparatus shown in FIG. 3.

FIG. 4 is a cross-sectional view of the X-Y carriage 32 taken in an X-plane through the central portion of the X-Y carriage. Chimney 58 extends from slightly below the carriage base 33 to slightly below the Y-carriage upper surface 63. The flue 59 extends through the full length of chimney 58 to provide a path for the evaporant E from the vapor inlet channel 37 shown in FIG. 3. A shutter mechanism 72 is pivoted about pin 73 and operates in response to the movement of control rod 74 which is fixedly connected to a first end 76 of mechanism 72. A second end 77 of the shutter mechanism 72 is positioned in such a manner as to permit the flow of the evaporant into the chimney flue 59 in response to the movement of the control rod 74. Control rod 74 extends through the wall of chamber 34 and may be operated by pushing or pulling the rod which causes the second end 77 of mechanism 72 to pivot about pin 73 in the desired direction.

Figure 6:
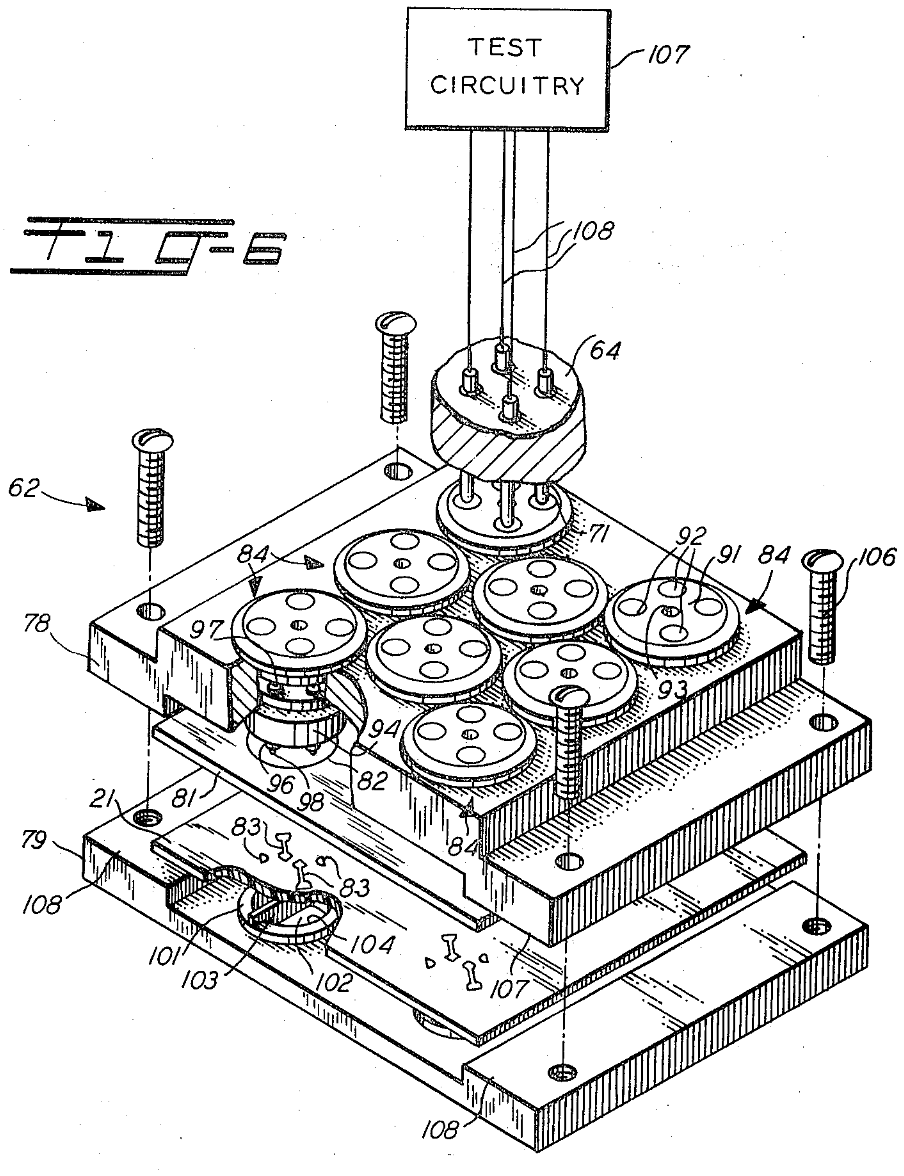
FIG. 6 is an exploded perspective view of the crystal holding fixture embodying features of the invention.
Figure 5:
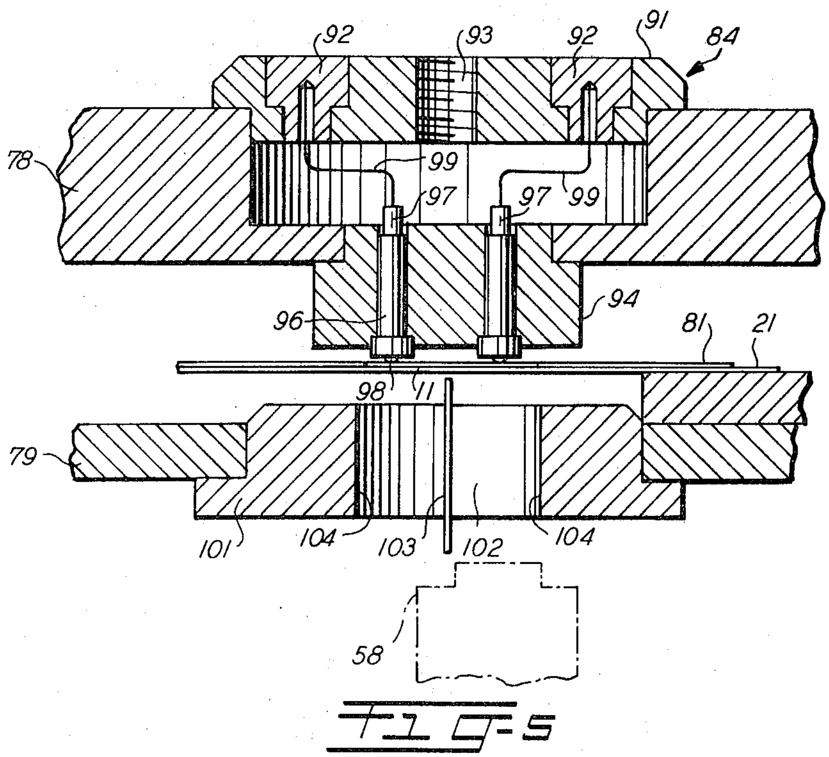
FIG. 5 is a partial cross-sectional view of the crystal holding fixture shown in phantom in FIG. 3.

FIGS. 5 and 6 present detailed views of an upper plate 78 and lower plate 79 of the crystal holding fixture 62. A nest 81 is located between plates 78 and 79 and has a plurality of apertures 82—82 to receive the MCF's 11 (shown in FIG. 5). The mask 21 having a plurality of mask apertures 83—83 (FIG. 6) is located between nest 81 and the lower plate 79. The apertures 83—83 expose selected portions or areas of the resonators to be adjusted and more particularity restrict the deposition of material only to those selected portions or areas.

The upper plate 78 has a plurality of connector caps 84—84 mounted therein. Each cap 84 is comprised of an insulative material 91 with a plurality of electrically conductive terminals 92 embedded therein and extending through each cap. A tapped hole 93 is provided at the center of each cap 84 to facilitate removal of the cap by use of a threaded puller rod or similar device (not shown). On the underside of upper plate 78, a plurality of insulative lower cap members 94—94 are aligned with each of the plurality of connector caps 84—84. A plurality of spring loaded connecting members 96—96 each having first and second ends 97 and 98, respectively, are embedded in each lower cap member 94 and extend therethrough. The first ends 97—97 are connected to the respective conducting terminals 92—92 by wires 99—99 (see FIG. 5). The second ends 98—98 are spring biased ball contacts.

Lower plate 79 has a plurality of openings with insulative inserts 101—101 mounted therein and aligned with the apertures 83—83 (FIG. 6) of mask 21, the nest apertures 82, lower cap member 94, and the connector caps 84. Each insulative insert 101 has an open central portion 102 which is divided by a partition 103 across a diameter of the opening forming two semi-circular openings 104—104.

In the first manufacturing step (i.e., baseplating) a plurality of piezoelectric crystal wafers 16 are placed in nest apertures 82—82, in intimate contact with mask 21. A second mask (not shown) is placed on the opposite face of the wafer. This sandwich of mask-wafer-mask is then base plated in any well-known manner. Once the base plating has been accomplished, one of the masks may be removed as only the face having the electrodes onto which adjusting material will be deposited requires the mask. It should be noted that the remaining mask is not normally removed from the crystal surface until the adjusting operation is completed. This procedure precludes the necessity of realigning the electrodes in the apertures between the baseplating operation and adjusting operation.

In the adjusting operation, the insulative, pliant mask 21 and the nested base plated MCF's 11—11 are placed on lower plate 79 in such a manner as to align each mask aperture 83 directly above one of the semi-circular openings 104—104. Upper plate 78 is then placed on top of lower plate 79 and fastened together by screws 106. Mask 21 and nest 81 are captured between the raised sections 107 and 108 of plates 78 and 79, respectively. Upon fastening upper plate 78 to lower plate 79, the spring loaded second ends 98—98 of connecting members 96—96 are brought into contact with the terminals 17—17 near the periphery of the each MCF 11. This urges the mask 21 into intimate contact with the wafer 16 with the material 23 forming a pliant interface between the mask base 22 and the wafer.

The assembled crystal holding fixture 62 with a plurality of MCF's 11 positioned therein is placed on the Y-carriage upper surface 63 in such a manner as to align all the inserts 101—101 directly above the holding fixture aperture 53. Bolts 61—61 are tightened to fasten the crystal holding fixture 62 in place. The cover 64 is fastened to vacuum chamber 34.

The chimney 58 is stationary while the crystal holding fixture 62, having the plurality of inserts 101—101 thereunder, may be moved by operation of the X-drive mechanism 44 and/or the Y-drive gear 51 to selectively locate any one of the resonator electrodes (i.e., electrodes 12 or 15 or electrodes 13 or 14) above the chimney flue 59. For example, as seen in FIG. 5, the chimney 58 is located directly below the right semi-circular opening 104 and evaporant passing up the chimney is applied through mask cutout 84 (FIG. 6) to an electrode. The partition 103, in combination with the position of the chimney 58 and the mask 21, prevents the evaporant E from being deposited on the adjacent electrode. When the desired position has been selected, the spring loaded output connecting pins 71—71 in cover 64 will be in contact with the conducting terminals 92—92 of one of the connector caps 84 (FIG. 6). The terminals 92—92 are electrically connected to the electrode terminal ends 17—17 via wires 99—99 (FIG. 5) and the second ends 98—98 of the spring loaded connecting member 96—96.

Once the desired initial alignment has been selected and the air in the chamber 34 evacuated, an evaporant E such as evaporated gold, is introduced through the bottom of apparatus 31 through the vapor inlet channel 37. As can be most clearly seen in FIGS. 3 and 4, the evaporant E is collimated upward through the flue 59 of the chimney 58 and into the selected semi-circular aperture 104 of the lower insert 101 of the crystal holding fixture 62. The evaporant E then flows through aperture 83 of mask 21 to further plate or load the resonator electrode (i.e., electrode 12 or 15 or electrode 13 or 14) selected to be adjusted.

As the evaporant E is deposited on the resonator electrode (i.e., electrode 12 or 15 or electrode 13 or 14), the frequency response of the resonator that is being adjusted is excited and monitored by test circuitry 109 located outside the apparatus 31. The test circuitry 109 is serially connected to the resonator electrode terminals 17—17 by wires 111—111, spring loaded output terminals 71—71, electrically conductive terminals 92—92, wires 99—99, and spring loaded connecting members 96—96. When the test apparatus indicates the desired predetermined frequency, the control rod 74 is actuated causing the second end 77 of the shutter mechanism 72 to fully cover the lower end of flue 59 of chimney 58 to stop the flow of the evaporant to the resonator electrode (electrode 12 or 15 or electrode 13 or 14) that is being adjusted. The X-Y carriage 32 is moved to bring a second resonator electrode (electrode 12 or 15 or electrode 13 or 14) into position to be adjusted. The shutter mechanism 72 is actuated to open the flue 59 to the evaporant and to permit the evaporant E to be deposited on the second resonator electrode until the desired resonant frequency has been attained.

Once all the resonators on the first MCF 11 have been adjusted a second MCF may now be selected by further operation of the X-drive mechanism 44 and/or the Y-drive gear 51. The foregoing operations are repeated until all the resonators formed by electrode pairs 12, 13, and 14, 15 with wafer 16, have been adjusted to predetermined resonant frequencies on all the MCF's 11. It should be noted that the adjustment of all resonators on all the MCF's 11 is accomplished without breaking the vacuum in chamber 34.

It should be realized that the actuation or operation of the X-drive mechanism 44, Y-drive gear 51 and the shutter mechanism 72 may be accomplished by any of a variety of automatic control equipments that are well known in the art.

Once all the MCF's 11 have been adjusted, the evaporant E and vacuum are shut off and the crystal holding fixture 62 is removed from the apparatus 31. The adjusted MCF's 11 are then removed from the crystal holding fixture 62 and new MCF's 11 to be adjusted may be inserted in nest 82 and the above adjusting process repeated.

As indicated hereinbefore, the instant method and apparatus have been found to be effective in adjusting discrete resonators or MCF's having a plurality of resonators. The frequency of the resonators of the MCF 11 shown in FIG. 1 when intimately engaged with the instant pliant, insulative mask, has been found to be substantially the same as the resonant frequency measured when the resonators are free of any contact for frequencies above 6MHz. However, for adjustment to resonant frequencies below 6MHz, the frequency response of the resonators has been found to be altered by a predictable amount due to contact with the instant mask. When required, adjustment of resonators in frequency ranges below 6MHz is simply accomplished by applying the known frequency offset (caused by the instant mask) to the values determined by the test apparatus.

A high degree of accuracy has been maintained while using the instant resilient, insulative mask. For example, resonators are adjusted to approximately 80Hz of an 8MHz nominal value with the method and apparatus heretofore described.

The exemplary embodiment of the instant invention describes the adjustment of the resonators by the deposition of gold on the base plated electrodes. However, the instant inventive concepts can also be implemented using other metals as well as nonmetals such as silicon which will adhere to the metallic electrodes. It is not the type of adjusting material but the amount of mas that is critical to the resonant frequency of the resonator.

As has been hereinbefore stated, the base 22 may be of any type of material that will provide sufficient dimensional stability or definition during deposition in order to obtain accurate resonant frequency adjustment. However, it should be clear that if more liberal adjustment tolerances are permissible, the use of base 22 may not be necessary. Thus, under such conditions, it is contemplated that a sheet of pliable material such as Teflon or Mylar could be used without the need for a base.

What is claimed is:

1. A method for adjusting the resonant frequency of a resonator, formed on a piezoelectric wafer, to a predetermined resonant frequency, said method comprising the steps of:

pliantly contacting a major surface of the wafer with a pliant mask having an aperture therein to expose a selectedd portion of the resonator;

depositing material on the selected portion of the resonator through the mask to adjust the resonant frequency of the resonator;

testing the resonator by exciting and monitoring the resonant frequency thereof as material is deposited on the selected portion; and stopping the deposition of material on the selected portion when the resonant frequency reaches a predetermined value.

2. A method for adjusting the resonant frequency of a resonator on a piezoelectric wafer to a predetermined resonant frequency, comprising the steps of:

intimately contacting the wafer with a pliant, insulative mask having an aperture therein to expose selected areas of the resonator;

depositing a material on the selected areas of the resonator through the mask to adjust the resonant frequency of the resonator;

exciting the resonator to resonance;

monitoring the resonant frequency of the excited resonator as the material is deposited on the selected areas; and stopping the deposition of material on the selected areas when the resonant frequency reaches a predetermined value.

3. A method for adjusting the resonant frequency of a resonator on a piezoelectric wafer to a predetermined resonant frequency, comprising the steps of:

intimately engaging at least one major surface of the wafer with a pliant, insulative mask having an aperture therein to expose a resonator electrode;

depositing a metal on the resonator electrode through the mask to adjust the resonant frequency of the resonator;

exciting the resonator to resonance;

monitoring the resonant frequency of the excited resonator as metal is deposited on the electrode; and stopping the deposition of metal on the electrode when the monitored resonant frequency of the resonator reaches a predetermined value.

4. A method for adjusting the frequency response of a monolithic crystal filter which includes a piezoelectric crystal wafer with a plurality of resonators formed thereon, said method comprising the steps of:

pliantly contacting a major surface of the wafer with a pliant mask having a plurality of apertures therein to expose at least one electrode of each resonator;

depositing a metal on an exposed electrode of a first resonator to adjust the resonant frequency of the first resonator;

exciting the first resonator to resonance;

monitoring the resonant frequency of the excited first resonator as metal is deposited on the exposed electrode thereof;

stopping the deposition of metal on the exposed electrode of the first resonator when the monitored resonant frequency of the resonator reaches a predetermined value;

depositing the metal on an exposed electrode of a second resonator to adjust the resonant frequency of the second resonator;

exciting the second resonator to resonance;

monitoring the resonant frequency of the excited second resonator as metal is being deposited on the exposed electrode thereof; and stopping the deposition of metal on the exposed electrode of the second resonator when the monitored resonant frequency of the resonator reaches a predetermined value.

5. A method of adjusting the resonant frequency of a resonator, formed on a piezoelectric wafer, to a predetermined resonant frequency, said method comprising:

forming a pliant interface between a mask having pliant material thereon and the piezoelectric wafer by urging the mask into intimate contact with the wafer with the pliant material therebetween;

depositing a material through the mask onto a selected portion of the resonator, intimate contact between the mask and wafer restricting the deposition of the material to the selected portion;

exciting the resonator to resonance while the material is deposited on the selected portion of the resonator, the pliant interface between the mask and the wafer permitting substantially free vibration of the excited resonator with the mask in intimate contact with the wafer;

monitoring the resonant frequency of the excited resonator while the material is being deposited on the selected electrode; and stopping the deposition of the material when a predetermined resonant frequency of the resonator is obtained.

6. A method of adjusting the resonant frequency of a resonator, formed on a piezoelectric wafer, to a predetermined resonant frequency, said resonator including two mutually opposed electrodes formed on either side of the piezoelectric wafer, said method comprising:

forming a pliant interface between a mask having a pliant material thereon and the piezoelectric wafer by urging the mask into intimate contact with the wafer with the pliant material therebetween;

depositing a metal through the mask onto a selected resonator electrode, intimate contact between the mask and wafer restricting the deposition of the metal to the selected electrode;

exciting the resonator to resonance while the metal is deposited on the selected electrode, the pliant interface between the mask and the wafer permitting substantially free vibration of the excited resonator with the mask in intimate contact with the wafer;

monitoring the resonant frequency of the excited resonator while the material is deposited on the selected electrode; and stopping deposition of the material when a predetermined resonant frequency of the resonator is obtained.

7. Apparatus for adjusting the frequency of a resonator on a piezoelectric wafer, comprising:

means for depositing a material;

means for contacting and masking portions of a major surface of the wafer and permitting substantially uninhibited excitation of the resonator while said means contacts said surface, including a pliant mask with an aperture therethrough to expose a selected portion of the resonator to the deposition means;

means for exciting the resonator and measuring the frequency response thereof as material from the deposition means is deposited on the selected portion; and means for stopping the deposition of material at a predetermined frequency, under the control of the exciting and measuring means.

8. An apparatus for adjusting the frequency of a resonator, formed on a piezoelectric wafer, to a predetermined resonant frequency, said apparatus comprising:

a mask having a pliant material thereon;

means for urging the mask into intimate contact with the wafer to expose a selected portion of the resonator while forming a pliant interface between the mask and the wafer;

means for depositing a material through the mask onto the selected portion of the resonator;

means for exciting the resonator to resonance while the material is deposited on the selected portion of the resonator;

means for monitoring the resonant frequency of the excited resonator while the material is being deposited on the selected portion of the resonator; and means responsive to the monitoring means for stopping deposition of the material when a predetermined resonant frequency of the resonator is obtained.

9. An apparatus for adjusting the frequency of a resonator, formed on a piezoelectric wafer, to a predetermined resonant frequency, said resonator including two mutually opposed electrodes formed on either side of the piezoelectric wafer, said apparatus comprising:

a mask having a pliant material thereon;

means for urging the mask into intimate contact with the wafer to expose a selected electrode while forming a pliant interface between the mask and the wafer;

means for depositing a material through the mask onto the selected electrode, intimate contact between the mask and the wafer restricting deposition of the material to the electrode;

means for exciting the resonator to resonance while the material is deposited on the selected electrode, the pliant interface between the mask and the wafer permitting substantially free vibration of the excited resonator with the mask in intimate contact with the wafer;

means for monitoring the resonant frequency of the excited resonator while the material is being deposited on the selected electrode; and means responsive to the monitoring means for stopping deposition of the material when a predetermined resonant frequency of the resonator is obtained.

10. In the apparatus as set forth in claim 9 wherein the material deposited through the mask onto the selected electrode is a metal.

11. Apparatus for adjusting the frequency response of a plurality of monolithic crystal filters in a vacuum chamber, without breaking the vacuum, comprising:

a metal evaporant source;

a mask, having a pliant, insulative coating thereon, in intimate contact with all the filters, having a plurality of apertures which expose at least one electrode of each resonator of every filter;

a crystal holding fixture to support the mask and filters;

a chimney, mounted within the chamber, having a first end proximate the metal evporant source;

means for supporting and indexing the crystal holding fixture above a second end of the chimney to sequentially present the exposed electrodes thereto;

means for exciting the resonators;

means for measuring the frequency of each excited resonator as the metal evaporant flows through the chimney onto the exposed electrode;

means for stopping the flow of evaporant, in response to the measuring means when a predetermined resonant frequency has been attained; and means for controlling the operation of the supporting and indexing means to sequentially present all the exposed electrodes to the evaporant to sequentially adjust all the resonators of all the filters to predetermined frequencies without breaking the vacuum.

12. The apparatus for adjusting the frequency of a plurality of monolithic crystal filters as set forth in claim 11, wherein the crystal holding fixture comprises:

an upper plate;

a lower plate having a plurality of holes which are aligned with the exposed electrodes of each filter; and a plurality of spring biased electrical contacts extending through the upper plate, having first ends connected to the measuring means and second ends that connect to the electrodes of the filters, which urge the filters into intimate contact with the mask when the upper and lower plates are fastened together.

* * * * *